(12) United States Patent
Reiter et al.

(10) Patent No.: US 10,998,132 B1
(45) Date of Patent: May 4, 2021

(54) CAPACITOR AND ELECTRONICS MODULE ASSEMBLY WITH LOW-INDUCTANCE CONNECTION FEATURES

(71) Applicants: Infineon Technologies AG, Neubiberg (DE); TDK Electronics AG, Munich (DE)

(72) Inventors: Tomas Manuel Reiter, Munich (DE); Karl Niklas, Itzelberg (DE)

(73) Assignees: Infineon Technologies AG, Neubiberg (DE); TDK Electronics AG, Munich (DE)

( * ) Notice: Subject to any disclaimer, the term of this patent is extended or adjusted under 35 U.S.C. 154(b) by 0 days.

(21) Appl. No.: 16/654,622

(22) Filed: Oct. 16, 2019

(51) Int. Cl.
*H05K 7/00* (2006.01)
*H01G 2/00* (2006.01)
*H01R 12/55* (2011.01)
*H05K 5/02* (2006.01)

(52) U.S. Cl.
CPC .............. *H01G 2/00* (2013.01); *H01R 12/55* (2013.01); *H05K 5/0247* (2013.01)

(58) Field of Classification Search
USPC ....................................................... 361/747
See application file for complete search history.

(56) References Cited

U.S. PATENT DOCUMENTS

| | | | |
|---|---|---|---|
| 2003/0072125 A1* | 4/2003 | Galvagni | H01G 4/30 361/306.3 |
| 2005/0133240 A1* | 6/2005 | Hidaka | H01G 2/10 174/527 |
| 2017/0025806 A1* | 1/2017 | Bittner | H01R 13/621 |

* cited by examiner

*Primary Examiner* — Hung S. Bui
(74) *Attorney, Agent, or Firm* — Murphy, Bilak & Homiller, PLLC

(57) ABSTRACT

A capacitor includes an electrically insulating housing that encloses an interior volume, first and second conductive connection pads that are each configured as externally accessible points of electrical contact to internal electrodes of the capacitor that are disposed within the housing, and an active capacitor dielectric material disposed within the housing and being configured as a dielectric medium between the internal electrodes, the first conductive connection pad having a first planar contact surface that is substantially parallel to a first sidewall of the housing, the second conductive connection pad having a second planar contact surface that is substantially parallel to the first sidewall, the first and second planar contact surfaces being offset from one another in a direction that is orthogonal to the first sidewall.

19 Claims, 7 Drawing Sheets

CAPACITOR AND ELECTRONICS MODULE ASSEMBLY WITH LOW-INDUCTANCE CONNECTION FEATURES

TECHNICAL FIELD

Embodiments of this invention generally relate to electronics assemblies, and particularly relate to electrical connections between an electronics module and a modular capacitor.

BACKGROUND

Consumer and industrial power applications such as power conversion applications and automotive applications utilize power semiconductor switching devices to control large voltages and/or currents associated with these applications. For example, power semiconductor switching devices are commonly used to control voltages on the order of 50 V (volts), 100 V, 500 V or more and/or to control currents on the order of 1 A (amperes), 10 A, 100 A, 400 A or more. Exemplary semiconductor switching devices that are commonly employed in this context include Insulated Gate Bipolar Transistors (IGBTs), Metal Oxide Semiconductor Field Effect Transistors (MOSFETs), Junction Field Effect Transistors (JFETs), diodes, etc.

One power switching device circuit topology that is commonly employed in power converters, such as DC to DC converters, AC to AC converters and AC to DC power converters, is a half-bridge circuit. A half-bridge circuit includes two series-connected switching devices and a capacitor connected in parallel across the two series connected switching devices. Voltage conversion is performed by rapidly switching the switching devices. An inductive load at the output of the half-bridge is charged/discharged by the applied voltages. The capacitor maintains a stable operating voltage across the half bridge during the switching events of the individual switches

SUMMARY

A capacitor is disclosed. According to an embodiment, the capacitor comprises an electrically insulating housing that encloses an interior volume, first and second conductive connection pads that are each configured as externally accessible points of electrical contact to internal electrodes of the capacitor that are disposed within the housing, and an active capacitor dielectric material disposed within the housing and being configured as a dielectric medium between the internal electrodes, the first conductive connection pad comprises a first planar contact surface that is substantially parallel to a first sidewall of the housing, the second conductive connection pad comprises a second planar contact surface that is substantially parallel to the first sidewall, and the first and second planar contact surfaces are offset from one another in a direction that is orthogonal to the first sidewall.

Separately or in combination, the capacitor further comprises an inactive material disposed between undersides of the first and second conductive connection pads and the active capacitor dielectric material, the undersides of the first and second conductive connection pads being opposite from the respective first and second planar contact surfaces, and the inactive material does not significantly contribute to the capacitance of the capacitor.

Separately or in combination, the inactive material comprises a thermally insulating material, and the inactive material is configured as a thermal insulation barrier between the undersides of the first and second conductive connection pads and the active capacitor dielectric material.

Separately or in combination, the inactive material comprises an elastic material, and the inactive material is mechanically coupled between the undersides of the first and second conductive connection pads and the active capacitor dielectric material.

Separately or in combination, the capacitor comprises an air gap disposed between the undersides of the first and second conductive connection pads and the active capacitor dielectric material.

Separately or in combination, the housing comprises a second sidewall that intersects with the first sidewall at a non-parallel angle, the capacitor further comprises third and fourth conductive connection pads that are each configured as externally accessible points of electrical contact to the internal electrodes of the capacitor that are disposed within the housing, the third conductive connection pad comprises a first planar contact surface that is substantially parallel to the second sidewall, the fourth conductive connection pad comprises a fourth planar contact surface that is substantially parallel to the second sidewall, and the first and second planar contact surfaces are offset from one another in a direction that is orthogonal to the second sidewall.

Separately or in combination, the capacitor comprises a first continuous section of metal that wraps around the intersection between the first and second sidewalls and comprises the first and third planar contact surfaces, and a second continuous section of metal that wraps around the intersection between the first and second sidewalls and comprises the second and fourth planar contact surfaces.

Separately or in combination, portions of the first and second continuous sections of metal directly overlap with one another.

Separately or in combination, the first continuous section comprises first, second, and third portions, the first and second portions forming an angled intersection with one another, the second and third portions forming an angled intersection with one another, the second continuous section comprises fourth, fifth, and sixth portions, the fourth and fifth portions forming an angled intersection with one another, the fifth and sixth portions forming an angled intersection with one another, the first portion overlaps with the fourth portion, the second portion overlaps with the fifth portion, and the third portion overlaps with the sixth portion.

An assembly is disclosed. According to an embodiment, the assembly comprises an electronics module comprising an electrically insulating substrate, a plurality of electronic components mounted on the substrate, and first and second connection lugs each being connected to one or more terminals of the one or more electronic components, the first and second connection lugs each comprise a planar base portion and a planar tab portion, the planar base portions of the first and second connection lugs directly overlap with one another, and the planar tab portions of the first and second connection lugs are laterally spaced apart from one another and overhang past an outer edge side of the module. The assembly further comprises a modular capacitor, comprising an electrically insulating housing that encloses an interior volume, connection pads that are configured as externally accessible points of electrical contact to internal electrodes of the capacitor that are disposed within the housing. The modular capacitor is mated with the first and second connection lugs such that the connection pads are respectively electrically connected to the first and second connection lugs.

Separately or in combination, the connection pads comprise first and second conductive connection pads that are each configured as externally accessible points of electrical contact to the internal electrodes of the capacitor, the first conductive connection pad comprises a first planar contact surface that is substantially parallel to a first sidewall of the housing, the second conductive connection pad comprises a second planar contact surface that is substantially parallel to the first sidewall, and the first and second planar contact surfaces are offset from one another in a direction that is orthogonal to the first sidewall.

Separately or in combination, the housing comprises a second sidewall that intersects with the first sidewall at a non-parallel angle, the connection pads further comprise third and fourth conductive connection pads that are each configured as externally accessible points of electrical contact to the internal electrodes of the capacitor, the third conductive connection pad comprises a third planar contact surface that is disposed over and substantially parallel to the second sidewall, the fourth conductive connection pad comprises a fourth planar contact surface that is disposed over and substantially parallel to the second sidewall, and the first and second planar contact surfaces are offset from one another in a direction that is orthogonal to the second sidewall.

Separately or in combination, the modular capacitor is mated with the first and second connection lugs such that the planar tab portion of the first connection lug is directly overlapping and electrically connected with the third planar contact surface, and the planar tab portion of the second connection lug is directly overlapping and electrically connected with the fourth planar contact surface.

Separately or in combination, the capacitor comprises a first continuous section of metal that wraps around the intersection between the first and second sidewalls and comprises the first and third planar contact surfaces, and a second continuous section of metal that wraps around the intersection between the first and second sidewalls and comprises the second and fourth planar contact surfaces, and portions of the first and second continuous sections of metal directly overlap with one another.

Separately or in combination, the first continuous section comprises first, second, and third portions, the first and second portions forming an angled intersection with one another, the second and third portions forming an angled intersection with one another, the second continuous section comprises fourth, fifth, and sixth portions, the fourth and fifth portions forming an angled intersection with one another, the fifth and sixth portions forming an angled intersection with one another, the first portion overlaps with the fourth portion, the second portion overlaps with the fifth portion, and the third portion overlaps with the sixth portion.

Separately or in combination, the modular capacitor is mated with the first and second connection lugs such that the planar tab portion of the first connection lug is directly overlapping and electrically connected with the first planar contact surface, and the planar tab portion of the second connection lug is directly overlapping and electrically connected with the second planar contact surface.

Separately or in combination, the capacitor further comprises an active capacitor dielectric material contained within the housing, the active capacitor dielectric material configured as a dielectric medium that provides capacitance between the electrodes, and an inactive material disposed above active capacitor dielectric material, the inactive material does not significantly contribute to the capacitance between the electrodes, and the inactive material is disposed between the first and second connection lugs and the active capacitor dielectric material.

Separately or in combination, the inactive material comprises a thermally insulating material, and the inactive material is configured as a thermal insulation barrier between the undersides of the first and second connection lugs and the active capacitor dielectric material.

Separately or in combination, the inactive material comprises an elastic material, and the inactive material is mechanically coupled between the undersides of the first and second conductive connection pads and the active capacitor dielectric material.

Separately or in combination, the inactive material encloses an air cavity, and the air cavity is disposed between the undersides of the first and second conductive connection pads and the active capacitor dielectric material.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A, 1B and 1C, depicts a modular capacitor, according to an embodiment.

FIG. 2, which includes FIGS. 2A, 2B and 2C, depicts a modular capacitor, according to an embodiment.

FIG. 3, which includes FIGS. 3A and 3B, depicts a modular capacitor, according to an embodiment. FIG. 3A depicts the modular capacitor from an isometric perspective; FIG. 3B depicts the modular capacitor along the cross-sectional line V-V'.

DETAILED DESCRIPTION

Embodiments of an electronics assembly with connection features that advantageously produce a low-inductance connection between an electronics module and a modular capacitor are described herein. This low-inductance connection can lead to improved performance by steepening the switching edges of the semiconductor devices performing the switching operation without increasing the voltage and or current overshoot during the switching events. The electronics module includes semiconductor switching devices mounted on a circuit board and connection lugs that laterally overhang past an edge side of the circuit board. The modular capacitor includes externally accessible connection pads that provide points of electrical contact to internal electrodes of the capacitor. Several features of the capacitor enable a low-resistance, low-inductance connection between the connection lugs and the connection pads. For example, the capacitor includes features that provide both a thermal insulation barrier and a stress absorbing mechanism between the connection pads and the active capacitor dielectric material. As a result, the electrical connection between the electronics module and the modular capacitor can be provided by welding the connection pads and connection lugs together. This provides a stable, low-inductance electrical connection. Furthermore, the assembly is configured to maximize the area overlap of the conductors connected to opposite sides of the capacitor. In particular, the connection lugs of the electronics module have an overlapping, criss-crossed configuration at the base portions. Moreover, the connection pads of the capacitor may be designed to include one or more overlapping regions. Providing one or both of these overlaps minimizes stray inductance by causing the electromagnetic fields generated by the two conductors to compensate one another.

Figures 1A, 1B, 1C:
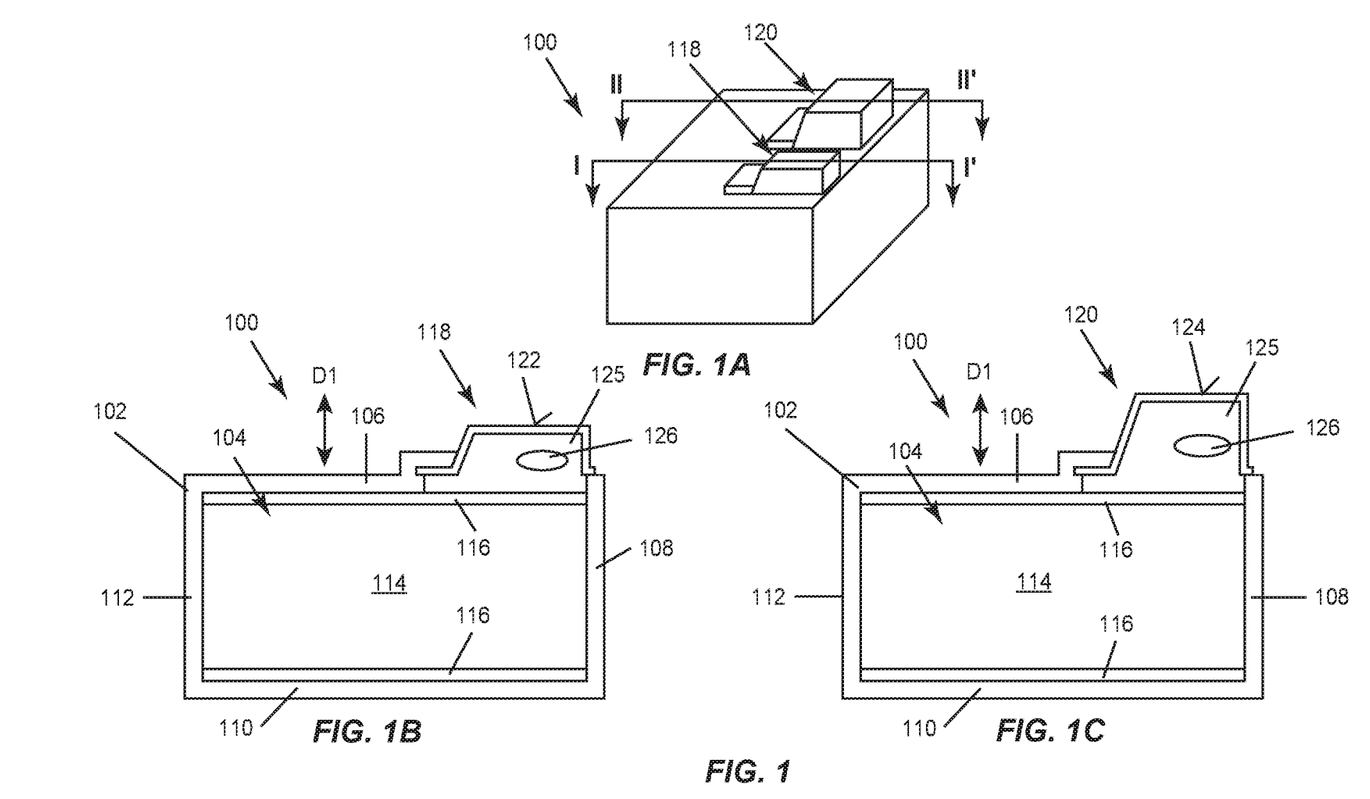
FIG. 1A depicts the modular capacitor from an isometric perspective.
FIG. 1B depicts the modular capacitor along the cross-sectional line I-I'.
FIG. 1C depicts the modular capacitor along the cross-sectional line II-II'.

Referring to FIG. 1, a capacitor 100 is depicted, according to an embodiment. The capacitor 100 includes a housing 102. The housing 102 encloses an interior volume 104, meaning that the housing 102 at least partially surrounds a three-dimensional space. The housing 102 is configured to protect active capacitor elements contained within the interior volume 104. Additionally, the housing 102 may be configured to electrically shield the active capacitor elements contained within the interior volume 104. To this end, the housing 102 may include electrically insulating materials such as plastic, ceramic, epoxy resin, etc., and/or metals, such as aluminium, iron, etc., and alloys thereof.

Generally speaking, the size, shape and configuration of the housing 102 may vary. In the depicted embodiment, the housing 102 has a cubic shape which includes first, second, third and fourth sidewalls 106, 108, 110 and 112. Each of the first, second, third and fourth sidewalls 106, 108, 110 and 112 intersect two other ones of the sidewalls at substantially perpendicular angles. More generally, the housing 102 can include any number of sidewalls, and these sidewalls can intersect one another at any non-parallel angle. Moreover, the housing 102 can include curved sidewalls, e.g. in the case of a cylindrically shaped housing 102.

The capacitor 100 includes an active capacitor dielectric material 114 that disposed within the interior volume 104 of the housing 102. The active capacitor dielectric material 114 can include one or more of a variety of dielectric materials, i.e., materials with a relative permittivity $\varepsilon_r$ of at least 1. Examples of these materials include plastics, plastic films, ceramics, liquids, glass, air, oxides, etc. The capacitor 100 additionally includes internal electrodes 116 that are disposed within the housing 102. The internal electrodes 116 can include one or more of a variety of electrically conductive materials, e.g., aluminium, copper, nickel, etc., and alloys thereof. In a commonly known manner, the active capacitor dielectric material 114 acts as a dielectric medium between the internal electrodes 116. That is, the active capacitor dielectric material 114 is configured to maintain an electric field between the internal electrodes 116 in the presence of an applied voltage, thereby enabling energy storage. As shown, the internal electrodes 116 and the active capacitor dielectric material 114 have a parallel-plate capacitor 100 configuration. More generally, the capacitor 100 can be configured such that the active elements within the housing 100 have any of a variety of known capacitor configurations, e.g., multi-layer configurations, multi-winding configurations, etc. Moreover, the capacitor 100 can be configured as a polarized capacitor (e.g., an electrolytic capacitor) or a non-polarized capacitor (e.g., a film capacitor).

The capacitor 100 includes first and second conductive connection pads 118, 120. The first and second conductive connection pads 118, 120 are each configured as externally accessible points of electrical contact to the internal electrodes 116 of the capacitor 100. That is, the first and second conductive connection pads 118, 120 are disposed outside of the housing 102 and provide a conductive connection to the internal electrodes 116. The first and second conductive connection pads 118, 120 can include one or more of a variety of electrically conductive materials, e.g., aluminium, copper, nickel, etc., and alloys thereof.

The first and second conductive connection pads 118, 120 each include planar contact surfaces that are configured to effectuate an electrical connection by interfacing with a corresponding planar conductor. According to an embodiment, these planar contact surfaces are substantially parallel to one of the sidewalls of the housing 102. More particularly, the first conductive connection pad 118 includes a first planar contact surface 122 that is substantially parallel to the first sidewall 106 of the housing 102, and the second conductive connection pad 120 includes a second planar contact surface 124 that is substantially parallel to the second sidewall 108.

According to an embodiment, the first and second planar contact surfaces 122, 124 are offset from one another in a first direction (D1) that is orthogonal to the first sidewall 106. Hence, the first and second conductive connection pads 118, 120 are configured such that electrical contact occurs on vertically offset planes. In the depicted embodiment, the offset is such that the second planar contact surface 124 is spaced further away from the first sidewall 106 than the first planar contact surface 122. In this configuration, both of the first and second planar contact surfaces 122, 124 are disposed above the first sidewall 106. Alternatively, at least one of the first and second planar contact surfaces 122, 124 may be disposed on a plane that is at or below the plane of the first sidewall 106.

According to an embodiment, the capacitor 100 includes an inactive material 125. The inactive material 125 is disposed between undersides of the first and second conductive connection pads 118, 120 that are opposite from the respective first and second planar contact surfaces 122, 124 and the active capacitor dielectric material 114. Thus, the active capacitor dielectric material 114 is separated from the first and second conductive connection pads 118, 120 at least by a region of the inactive material 125. As shown, the inactive material 125 supplants a section of the housing 100. Alternatively, the capacitor 100 can be configured such that the first sidewall 106 extends directly underneath the first and second conductive connection pads 118, 120. In that case, the inactive material 125 can be provided above or below the first sidewall 106.

The inactive material 125 is configured such that it does not significantly contribute to the capacitance of the capacitor 100. This means that the arrangement and/or material properties of the inactive material 125 are selected such that the inactive material 125 has a negligible (e.g., less than 2%) effect on the overall capacitance of the capacitor 100. Regarding the physical arrangement, as shown, the inactive material 125 can be disposed outside of the region between the internal electrodes 116. Hence, the inactive material 125 does not influence the electric field that develops between the internal electrodes 116 of the capacitor 100 under an applied voltage. Regarding material properties, the inactive material 125 can include electrical insulators with a relative permittivity $\varepsilon_r$ less than that of the active capacitor material 114. According to an embodiment, the relative permittivity $\varepsilon_r$ of the inactive material 125 is no greater than one half of the relative permittivity $\varepsilon_r$ less than that of the active capacitor material 114.

According to an embodiment, the inactive material 125 is configured as a thermal insulation barrier between the undersides of the first and second conductive connection pads 118, 120 and the active capacitor dielectric material 114. In this embodiment, the undersides of the first and second conductive connection pads 118, 120 are physically separated from the active capacitor dielectric material 114 by the inactive material 125. Moreover, the inactive material 125 includes a thermally insulating material. As used herein, a thermally insulating material refers to any material having a thermal conductivity that is lower than 20 $W \cdot m^{-1} \cdot K^{-1}$ at 25° C. Exemplary thermally insulating materials include plastics, particularly PBT plastics with a thermal conductivity of less than 0.5 $W \cdot m^{-1} \cdot K^{-1}$ at 25° C. carbon based allotropes, e.g., graphite, and closed cell foams such as Styrofoam®.

According to an embodiment, the inactive material 125 is configured as a stress absorbing mechanism that is mechanically coupled between the undersides of the first and second conductive connection pads 118, 120 and the active capacitor dielectric material 114. In this embodiment, the inactive material 125 includes an elastic material. As used herein, an elastic material refers to any material having an elastic modulus (i.e., a modulus of elasticity) that is less than or about equal to 20 GPa. Exemplary elastic material include rubber, plastics, e.g., polyethylene, carbon-based allotropes, e.g., graphite, closed cell foams such as Styrofoam®.

Optionally, one or more air gaps 126 may be provided. The air gaps 126 may be enclosed by the inactive material 125 (as shown). Alternatively, the air gaps 126 may correspond to a region underneath the first and second conductive connection pads 118, 120 that is unfilled with the inactive material 125. The air gap 126 may contain ambient air or another gaseous filling 114. By including one or more air gaps 126, the capacitor 100 provides enhanced thermal insulation capability and enhanced stress absorbing capability between the undersides of the first and second conductive connection pads 118, 120 and the active capacitor dielectric material 114. This enhances weldability for the reasons stated herein.

According to an embodiment, the material composition of the inactive material 125 can be selected to have at least one of the following: a lower dielectric constant than the active capacitor dielectric material 114, a lower elastic modulus than that of the housing 102, and a lower thermal conductivity than that of the housing 102.

By configuring the inactive material 125 according to one or more of the above discussed embodiments, the capacitor 100 is advantageously well suited for weldability. Welding techniques are generally understood as techniques that fuse two discrete metallic components together through sufficient heat and/or mechanical pressure. These techniques can be used to effectuate an electrical connection between the interconnection pads of a modular capacitor and connection lugs of an electronics module. However, welding techniques that are cost-effective and precise enough to effectuate a reliable electrical connection require highly concentrated heat, e.g., on the order of 1 $MW/cm^2$, and/or substantial mechanical pressure to be applied to the fused components during the weld. One example of such a technique is a so-called laser welding technique, which requires placing the two mating surfaces firmly together with zero or close to zero gap between them while a laser generates highly concentrated heat in the fusing location. The placement of the two mating surfaces with near zero gap can be realized by pressing the two mating surfaces together. By configuring the inactive material 125 as a thermal insulation barrier, the capacitor 100 is designed to protect the active dielectric material from damaging heat generated during the welding process. By configuring the inactive material 125 as a stress absorbing mechanism, the capacitor 100 is designed to protect the active capacitor dielectric material 114 from damaging mechanical pressure that is applied during the welding process.

Figures 2A, 2B, 2C:
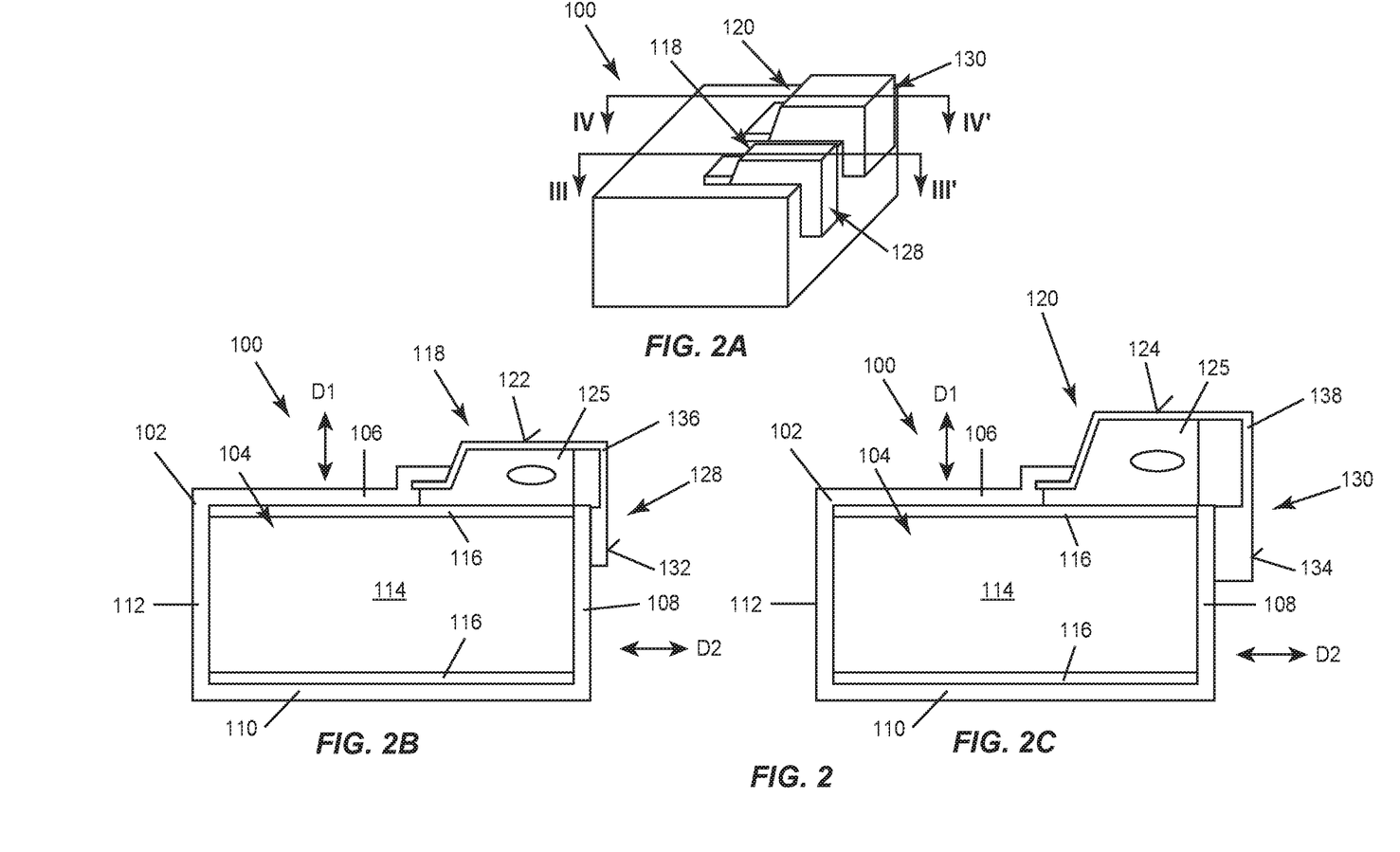
FIG. 2A depicts the modular capacitor from an isometric perspective.
FIG. 2B depicts the modular capacitor along the cross-sectional line III-III'.
FIG. 2C depicts the modular capacitor along the cross-sectional line IV-IV'.

Referring to FIG. 2, the capacitor 100 is depicted, according to another embodiment. In this embodiment, the capacitor 100 further includes third and fourth conductive connection pads 128, 130 that are each configured as externally accessible points of electrical contact to the internal electrodes 116 of the capacitor 100. Hence, the third and fourth conductive connection pads 128, 130 represent alternate/additional points of electrical contact to the internal electrodes 116 than the first and second conductive connection pads 118, 120, as previously described.

The third and fourth conductive connection pads 128, 130 each include planar contact surfaces that are substantially parallel the second sidewall 108. More particularly, the third conductive connection pad 128 includes a third planar contact surface 132 that is substantially parallel to the second sidewall 108, and the fourth conductive connection pad 130 includes a fourth planar contact surface 134 that is substantially parallel to the second sidewall 108.

The third and fourth conductive connection pads 128, 130 are offset from one another in a second direction D2 that is orthogonal to the second sidewall 108. Hence, the third and fourth conductive connection pads 128, 130 may have a similar offset, relative to the second sidewall 108, as the first and second conductive connection pads 118, 120 have relative to the first sidewall 106.

According to an embodiment, the capacitor 100 includes at least one continuous section of metal that wraps around an intersection between the first and second sidewalls 106, 108 and provides a conductive connection pad on each sidewall. As used herein, "wraps around" means that the continuous section of metal is disposed directly over the two intersecting surfaces and includes an angle or bend that changes orientation to produce two planar surfaces that extend along different planes. A section that "wraps around" does not necessarily require direct contact between the continuous section of metal and the surfaces.

In the embodiment depicted in FIG. 2, the capacitor 100 includes a first continuous section 136 of metal that wraps around the intersection between the first and second sidewalls 106, 108. In this configuration, the first and third conductive connection pads 118, 128 are provided by a single piece of metal. The first continuous section 136 of metal includes the first and third contact surfaces 120, 132. Correspondingly, the capacitor 100 includes a second continuous section 138 of metal that wraps around the intersection between the first and second sidewalls 106, 108. The second continuous section 138 of metal includes the second and fourth contact surfaces 122, 134.

Figures 3, 3A, 3B:
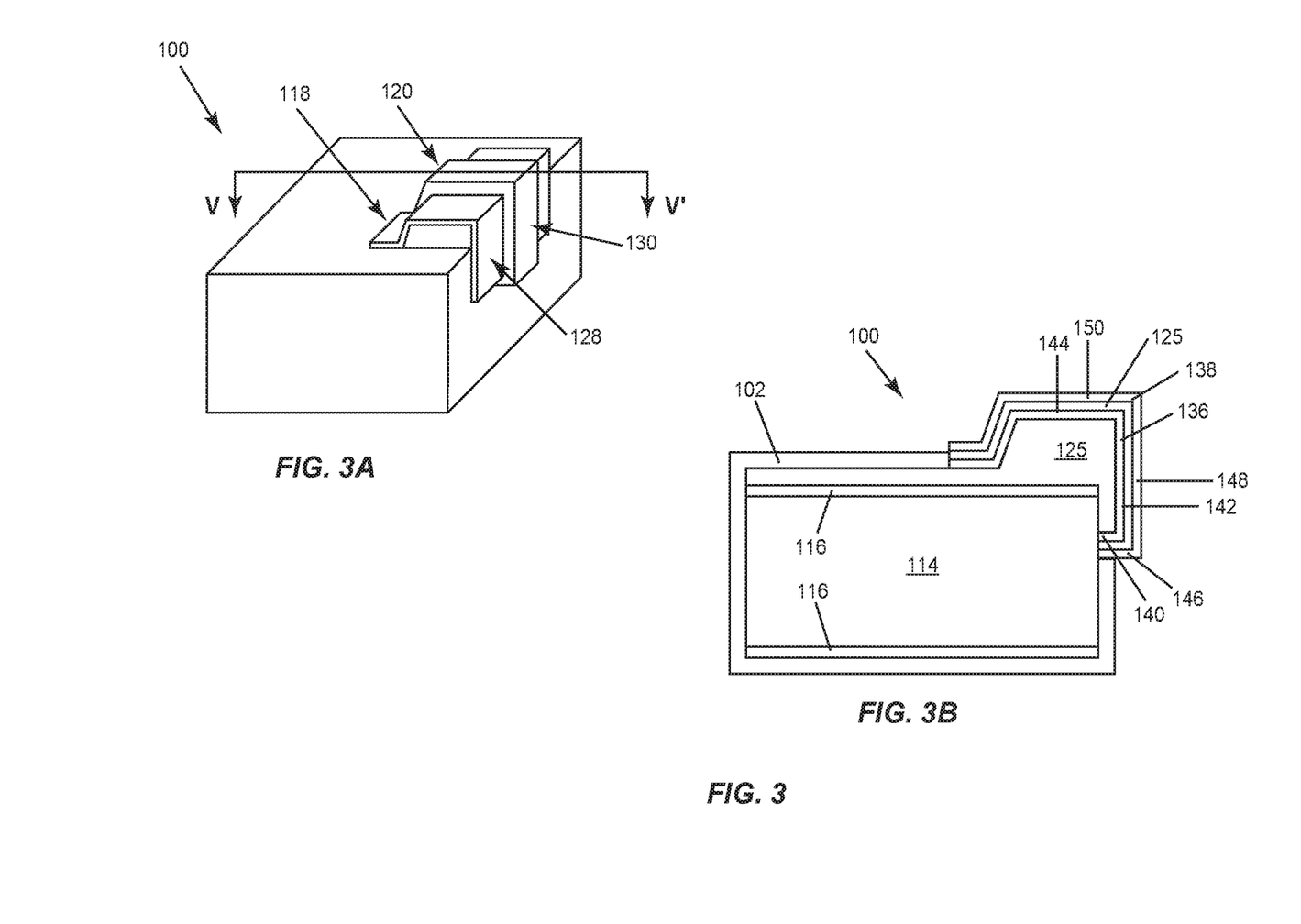

Referring to FIG. 3, the capacitor 100 is depicted, according to another embodiment. In this embodiment, portions of the first and second continuous sections 136, 138 of metal directly overlap with one another. As shown in FIG. 3, a portion of the second continuous section 138 is disposed directly above a portion of the first continuous section 136.

According to an embodiment, the directly overlapping regions of the first and second continuous sections 136, 138 occur in two or more different planar orientations. For example, in the embodiment of FIG. 3, the first continuous section 136 includes first, second, and third portions 140, 142, 144, the second continuous section 138 includes fourth, fifth, and sixth portions 146, 148, 150 and the overlap occurs between these sections. More particularly, the first portion 140 overlaps with the fourth portion 146, the second portion 142 overlaps with the fifth portion 148, and the third portion 144 overlaps with the sixth portion 150. As shown, the first and fourth portions 140, 146 can be separated from one another by the inactive material 125, as can the second and fifth portions 142 as well as the third and sixth portions 144, 150. The first and second portions 140, 142 form an angled intersection with one another, e.g., at about 90 degrees as depicted, and the second and third portions 142, 144 form an angled intersection with one another, e.g., at about 90 degrees as depicted. Similarly, the fourth and fifth portions 146, 148 form an angled intersection with one another, e.g., at about 90 degrees as depicted, and the fifth and sixth portions 148, 150 form an angled intersection with one another, e.g., at about 90 degrees as depicted.

One advantage of the overlapping contact pad design as described with reference to FIG. 3 is an enhanced spring effect. By configuring the connection pads to include multiple angled bends and/or a retrograde shape, the connection pads behave as a spring in the presence of mechanical pressure. Hence, this design can be beneficial for the weldability of the connection pads for the reasons stated above, as it alleviates mechanical pressure applied to the active capacitor dielectric material 114.

Another advantage of the overlapping contact pad design as described with reference to FIG. 3 is an increased area of overlap between the two conductive elements that are connected to opposite electrodes of the capacitor 100. When the capacitor 100 is charged and discharged by electric current, magnetic field compensation occurs in the regions of direct overlap. The result is a reduction in parasitic stray inductances in comparison to a side-by-side design.

More generally, the above described mechanical and electrical benefits may be obtained by configuring the first and second continuous sections 136, 138 to each have a wrap-around shape and/or by configuring the first and second continuous sections 136, 138 to overlap with one another on one, two or more different planes. A wrap-around shape refers to any shape which changes direction by more than 90 degrees, e.g., a C-shape, S-shape, U-Shape, etc.

Figure 4:
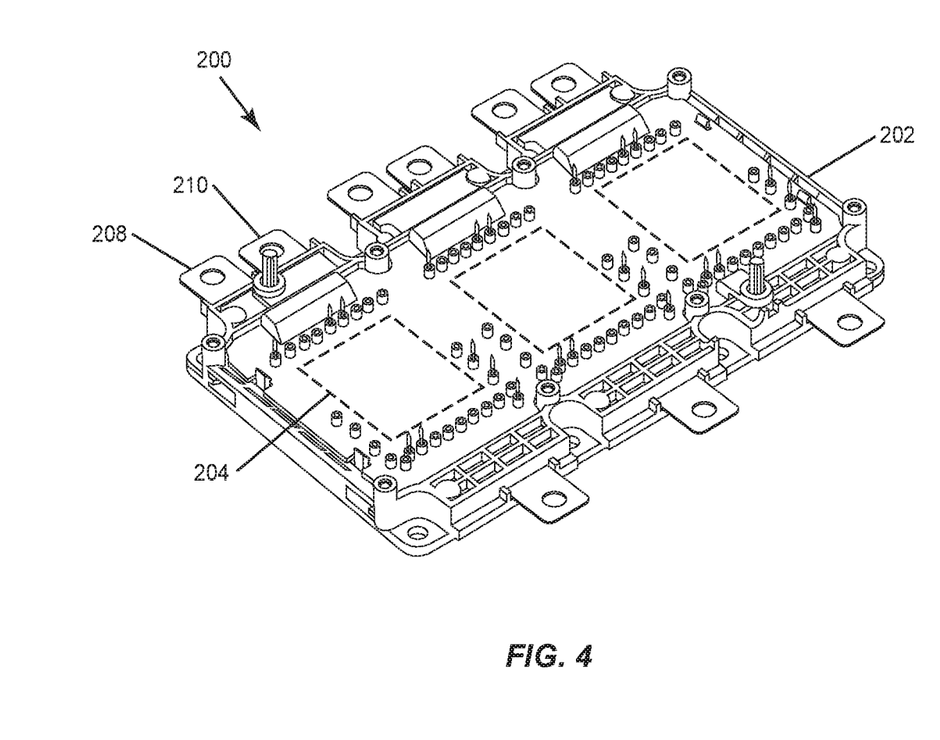
FIG. 4 depicts an electronics module, according to an embodiment.

Referring to FIG. 4, an electronics module 200 is depicted, according to an embodiment. Generally speaking, an electronics module refers to any apparatus with a substrate that is configured to accommodate multiple electronic components, e.g., semiconductor chips, passive devices, etc. and facilitate electrical connection between these elements. The substrate may be formed from electrical insulators, such as DCB, AMD, IMS, etc.

In the depicted embodiment, the electronics module 200 includes a precast substrate 202 that is designed to be combined with various other features, e.g., signal connectors, frame connectors, etc., to provide a complete electronic assembly. The electronics module 200 includes first and second connection lugs 208, 210. The first and second connection lugs 208, 210 are planar tabs of electrically conductive material (e.g., metal such as copper or aluminum). The first and second connection lugs 208, 210 may be electrically accessed by electrically conductive routing structures (not shown) that are placed directly on top of the substrate 202. Semiconductor power switching devices (e.g., IGBTs) may be mounted on these routing structures in the designated chip regions 204. As a result, the terminals of the semiconductor power switching devices may be electrically accessible via the first and second connection lugs 208, 210. The electronics module 200 may be combined with a circuit board, e.g., a commercially available PCB, which includes application specific circuitry and passive components (e.g., capacitors, inductors, etc). The circuit board may be provided on top of the electronics module. In an embodiment, the electronics module provides contact pins at the top surface onto which the circuit board can be mounted and thus conductively be connected.

Figure 5:
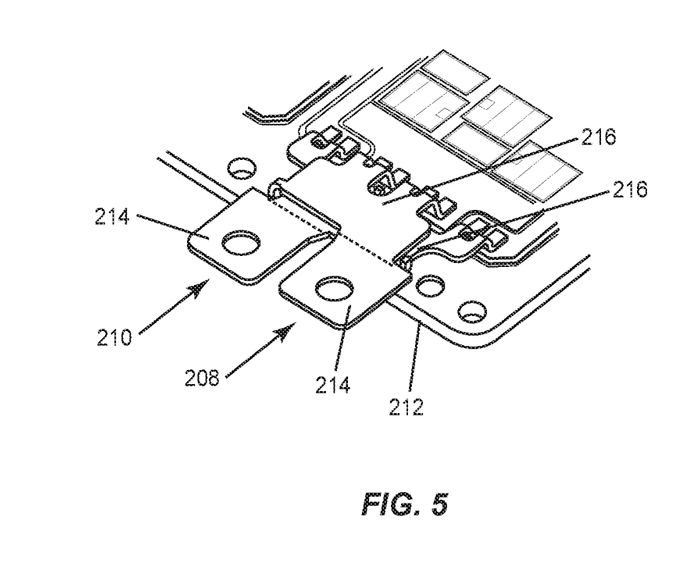
FIG. 5 depicts a close-up view of the connection lugs of an electronics module, according to an embodiment.

Referring to FIG. 5, a close-up view of the first and second connection lugs 208, 210 for an electronics module 200 having a criss-crossed and overlapping configuration is depicted, according to an embodiment. In this embodiment, the first and second connection lugs 208, 210 each include a planar base portion 214 and a planar tab portion 216. The base portions 214 of the first and second connection lugs 208, 210 are disposed over and attached to the circuit board 202. The base portions 242 of the first and second connection lugs 208, 210 directly overlap with one another. Specifically, the planar base portion 214 of the first connection lug 208 is disposed directly above the planar base portion 214 of the second connection lug 210. The tab portions 216 of the first and second connection lugs 208, 210 laterally overhang past an outer edge side 212 of the electronics module 200 and thus provide an externally accessible contact surface.

The criss-crossed and overlapping configuration of the first and second connection lugs 208, 210 advantageously mitigates parasitic effects in the electrical connection between the electronics module 200 and an external capacitor. Specifically, in the overlapping base regions, which may represent a significant area percentage (e.g., 50% or more) of the connection lugs, the electromagnetic fields compensate one another, which mitigates parasitic stray inductance.

Figure 6:
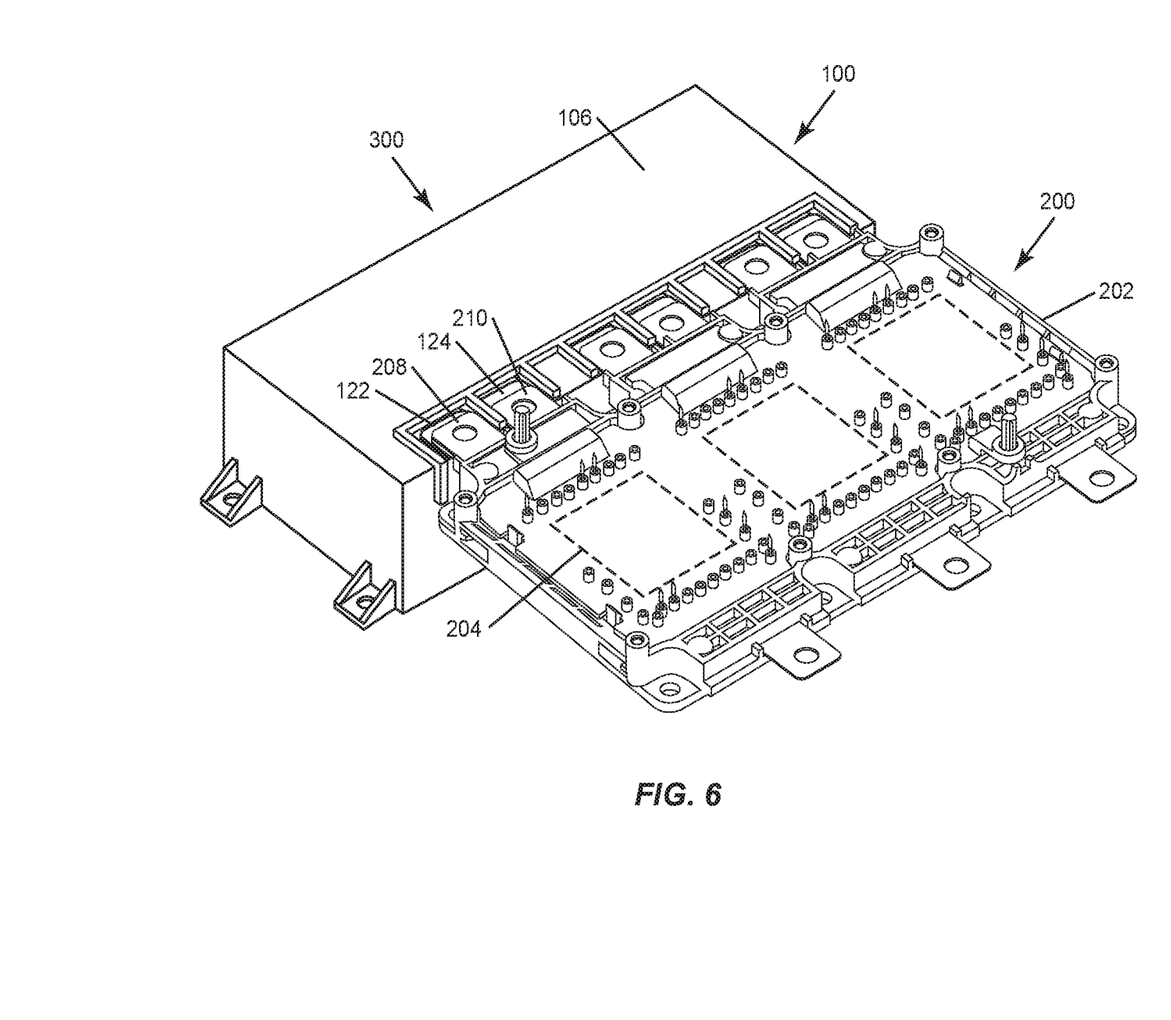
FIG. 6 depicts an assembly that includes an electronics module connected to a modular capacitor, according to an embodiment.

Referring to FIG. 6, an assembly 300 that includes the electronics module 200 and the capacitor 100 is depicted, according to an embodiment. In this embodiment, the first and second connection lugs 208, 210 may have the criss-crossed and overlapping configuration as previously described. In the assembly 300, the modular capacitor 100 is mated with the first and second connection lugs 208, 210 such that the connection pads are electrically connected to the first and second connection lugs 208, 210. The electrical connection between the modular capacitor 100 and the connection lugs is provided by direct contact between the two elements. According to an embodiment, this electrical connection can be produced by welding the connection pads of the capacitor 100 together with the first and second connection lugs 208, 210.

In the embodiment of FIG. 6, the modular capacitor 100 is mated with the first and second connection lugs 208, 210 of the module 200 such that the planar tab portion 214 of the first connection lug 208 is directly overlapping and electrically connected with the first planar contact surface 122 of the first connection pad 118 and such that the planar tab portion 214 of the second connection lug 210 is directly overlapping and electrically connected with the second planar contact surface 124 of the second connection pad 120. Hence, in this embodiment, the capacitor 100 is oriented such that the first and second conductive connection pads 118, 120 provide electrically connectivity with the first and second connection lugs 208, 210.

In the embodiment of FIG. 6, the assembly 300 includes, in addition to the above described electrical connections, additional matings between connection lugs of the module 200 and connection pads of the capacitor 100. These additional mattings may correspond to separate connections between a further capacitor structure provided in the capacitor 100 and an additional circuit provided on the module 200. Alternatively, these mattings may be additive connections that connect to the same two internal electrodes of the capacitor 100.

Figure 7:
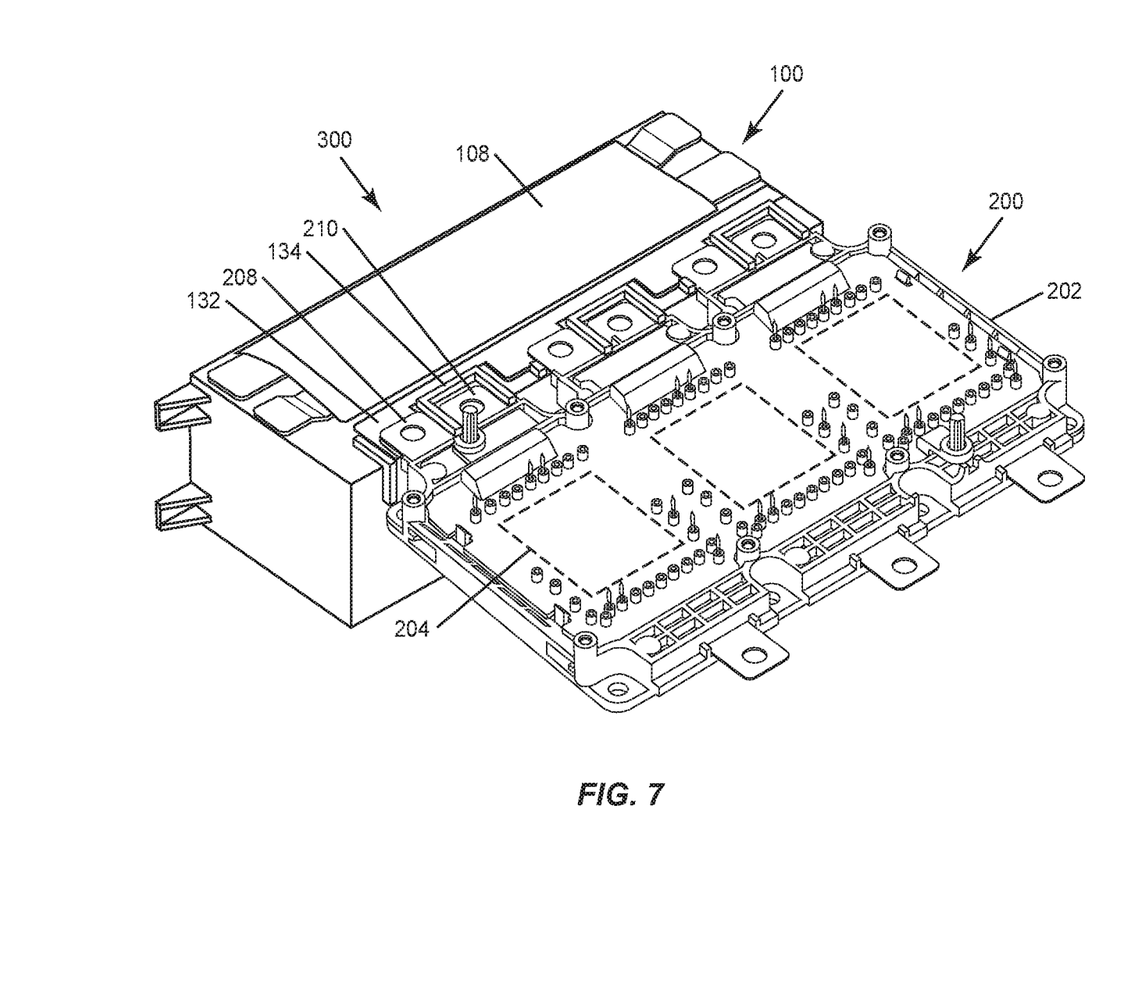
FIG. 7 depicts an assembly that includes an electronics module connected to a modular capacitor, according to an embodiment.

Referring to FIG. 7, an assembly 300 that includes an electronics module 200 and the capacitor 100 is depicted, according to another embodiment. In the assembly 300, the modular capacitor 100 is mated with the first and second connection lugs 208, 210 such that the connection pads are electrically connected to the first and second connection lugs 208, 210. Different from the embodiment of FIG. 6, the capacitor 100 is rotated such that electrical connectivity occurs at a different side of the capacitor 100. In this embodiment, the modular capacitor 100 is configured to include the third and fourth conductive connection pads 128, 130 as described with reference to FIG. 2. The modular capacitor 100 is mated with the first and second connection lugs 208, 210 such that the planar tab portion 214 of the first connection lug 208 is directly overlapping and electrically connected with the third planar contact surface 132 of the third connection pad 128 and such that the planar tab portion 214 of the second connection lug 210 is directly overlapping and electrically connected with the fourth planar contact surface 134 of the fourth connection pad 130. Hence, in this embodiment, the capacitor 100 is oriented such that the third and fourth conductive connection pads 128, 130 provide electrically connectivity with the first and second connection lugs 208, 210.

As illustrated by FIGS. 6 and 7, the provision of externally accessible points of electrical contact on two different sidewalls of the capacitor 100 advantageously provides versatility for the space footprint of the assembly 300. By allowing the capacitor 100 to be rotated in two different positions, the footprint of the assembly 300 can be adapted to meet different space constraints.

One advantage of providing the height offset between the first and second conductive connection pads 118, 120 and/or between the third and fourth conductive connection pads 128, 130 is enhanced compatibility with an electronics module 200 having the criss-crossed and overlapping configuration of the connection lugs. The height offset allows for each of the first and second connection lugs 208, 210 to be formed such that the planar base portions 212 and the planar tab portion 214 of each connection lug extend along a single plane and such that the base portion 212 of two connection lugs vertically overlap with one another. Hence, the above described advantages with respect to parasitic inductance can be obtained while simultaneously having connection lugs that are inexpensive to form and have low electrical resistance.

The term "substantially" as used herein encompasses absolute conformity with the specified requirement as well as minor deviations from absolute conformity with the requirement due to manufacturing process variations, assembly 300, and other factors that may cause a deviation from the design goal. Provided that the deviation is within process tolerances so as to achieve practical conformity and the components described herein are able to function according to the application requirements, the term "substantially" encompasses any of these deviations.

The term "electrically connected," "directly electrically connected" and the like as used herein describes a permanent low-impedance connection between electrically connected elements, for example a direct contact between the relevant elements or a low-impedance connection via a metal and/or a highly doped semiconductor.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A capacitor, comprising:
    an electrically insulating housing that encloses an interior volume;
    first and second conductive connection pads that are each configured as externally accessible points of electrical contact to internal electrodes of the capacitor that are disposed within the housing;
    an active capacitor dielectric material disposed within the housing and being configured as a dielectric medium between the internal electrodes; and
    an inactive material disposed between undersides of the first and second conductive connection pads and the active capacitor dielectric material, the undersides of the first and second conductive connection pads being opposite from the respective first and second planar contact surfaces,
    wherein the inactive material does not significantly contribute to the capacitance of the capacitor,
    wherein the first conductive connection pad comprises a first planar contact surface that is substantially parallel to a first sidewall of the housing,
    wherein the second conductive connection pad comprises a second planar contact surface that is substantially parallel to the first sidewall, and
    wherein the first and second planar contact surfaces are offset from one another in a direction that is orthogonal to the first sidewall.

2. The capacitor of claim 1, wherein the inactive material comprises a thermally insulating material, and wherein the inactive material is configured as a thermal insulation barrier between the undersides of the first and second conductive connection pads and the active capacitor dielectric material.

3. The capacitor of claim 1, wherein the inactive material comprises an elastic material, and wherein the inactive material is mechanically coupled between the undersides of the first and second conductive connection pads and the active capacitor dielectric material.

4. The capacitor of claim 1, wherein the capacitor comprises an air gap between the undersides of the first and second conductive connection pads and the active capacitor dielectric material.

5. The capacitor of claim 1, wherein the capacitor comprises:
a first continuous section of metal that wraps around the intersection between the first and second sidewalls and comprises the first and third planar contact surfaces; and
a second continuous section of metal that wraps around the intersection between the first and second sidewalls and comprises the second and fourth planar contact surfaces.

6. The capacitor of claim 5, wherein portions of the first and second continuous sections of metal directly overlap with one another.

7. The capacitor of claim 6, wherein the first continuous section comprises first, second, and third portions, the first and second portions forming an angled intersection with one another, the second and third portions forming an angled intersection with one another, wherein the second continuous section comprises fourth, fifth, and sixth portions, the fourth and fifth portions forming an angled intersection with one another, the fifth and sixth portions forming an angled intersection with one another, wherein the first portion overlaps with the fourth portion, the second portion overlaps with the fifth portion, and the third portion overlaps with the sixth portion.

8. An assembly, comprising:
an electronics module comprising:
an electrically insulating substrate;
a plurality of electronic components mounted on the substrate; and
first and second connection lugs each being connected to one or more terminals of the one or more electronic components,
wherein the first and second connection lugs each comprise a planar base portion and a planar tab portion,
wherein the planar base portions of the first and second connection lugs directly overlap with one another, and
wherein the planar tab portions of the first and second connection lugs are laterally spaced apart from one another and overhang past an outer edge side of the electronics module, and
a modular capacitor, comprising:
an electrically insulating housing that encloses an interior volume;
connection pads that are configured as externally accessible points of electrical contact to internal electrodes of the capacitor that are disposed within the housing, and
wherein the modular capacitor is mated with the first and second connection lugs such that the connection pads are electrically connected to the first and second connection lugs.

9. The assembly of claim 8, wherein the connection pads comprise first and second conductive connection pads that are each configured as externally accessible points of electrical contact to the internal electrodes of the capacitor, wherein the first conductive connection pad comprises a first planar contact surface that is substantially parallel to a first sidewall of the housing, wherein the second conductive connection pad comprises a second planar contact surface that is substantially parallel to the first sidewall, and wherein the first and second planar contact surfaces are offset from one another in a direction that is orthogonal to the first sidewall.

10. The assembly of claim 9, wherein the housing comprises a second sidewall that intersects with the first sidewall at a non-parallel angle, wherein the connection pads further comprise third and fourth conductive connection pads that are each configured as externally accessible points of electrical contact to the internal electrodes of the capacitor, wherein the third conductive connection pad comprises a third planar contact surface that is disposed over and substantially parallel to the second sidewall, wherein the fourth conductive connection pad comprises a fourth planar contact surface that is disposed over and substantially parallel to the second sidewall, and wherein the first and second planar contact surfaces are offset from one another in a direction that is orthogonal to the second sidewall.

11. The assembly of claim 10, wherein the modular capacitor is mated with the first and second connection lugs such that:
the planar tab portion of the first connection lug is directly overlapping and electrically connected with the third planar contact surface; and
the planar tab portion of the second connection lug is directly overlapping and electrically connected with the fourth planar contact surface.

12. The assembly of claim 9, wherein the capacitor comprises:
a first continuous section of metal that wraps around the intersection between the first and second sidewalls and comprises the first and third planar contact surfaces; and
a second continuous section of metal that wraps around the intersection between the first and second sidewalls and comprises the second and fourth planar contact surfaces, and
wherein portions of the first and second continuous sections of metal directly overlap with one another.

13. The assembly of claim 12, wherein the first continuous section comprises first, second, and third portions, the first and second portions forming an angled intersection with one another, the second and third portions forming an angled intersection with one another, wherein the second continuous section comprises fourth, fifth, and sixth portions, the fourth and fifth portions forming an angled intersection with one another, the fifth and sixth portions forming an angled intersection with one another, wherein the first portion overlaps with the fourth portion, the second portion overlaps with the fifth portion, and the third portion overlaps with the sixth portion.

14. The assembly of claim 9, wherein the modular capacitor is mated with the first and second connection lugs such that:
the planar tab portion of the first connection lug is directly overlapping and electrically connected with the first planar contact surface; and
the planar tab portion of the second connection lug is directly overlapping and electrically connected with the second planar contact surface.

15. The assembly of claim 14, wherein the capacitor further comprises:
an active capacitor dielectric material contained within the housing, the active capacitor dielectric material configured as a dielectric medium that provides capacitance between the electrodes; and an inactive material disposed above active capacitor dielectric material, wherein the inactive material does not significantly contribute to the capacitance between the electrodes, and wherein the inactive material is disposed between the first and second connection lugs and the active capacitor dielectric material.

16. The assembly of claim 15, wherein the inactive material comprises a thermally insulating material, and wherein the inactive material is configured as a thermal insulation barrier between the undersides of the first and second connection lugs and the active capacitor dielectric material.

17. The assembly of claim 15, wherein the inactive material comprises an elastic material, and wherein the inactive material is mechanically coupled between the undersides of the first and second conductive connection pads and the active capacitor dielectric material.

18. The assembly of claim 15, wherein the capacitor comprises an air gap disposed between the undersides of the first and second conductive connection pads and the active capacitor dielectric material.

19. A capacitor, comprising:
an electrically insulating housing that encloses an interior volume;
first, second, third and fourth conductive connection pads that are each configured as externally accessible points of electrical contact to internal electrodes of the capacitor that are disposed within the housing; and
an active capacitor dielectric material disposed within the housing and being configured as a dielectric medium between the internal electrodes,
wherein the first conductive connection pad comprises a first planar contact surface that is substantially parallel to a first sidewall of the housing,
wherein the second conductive connection pad comprises a second planar contact surface that is substantially parallel to the first sidewall,
wherein the first and second planar contact surfaces are offset from one another in a direction that is orthogonal to the first sidewall,
wherein the housing comprises a second sidewall that intersects with the first sidewall at a non-parallel angle,
wherein the third conductive connection pad comprises a first planar contact surface that is substantially parallel to the second sidewall,
wherein the fourth conductive connection pad comprises a fourth planar contact surface that is substantially parallel to the second sidewall, and
wherein the first and second planar contact surfaces are offset from one another in a direction that is orthogonal to the second sidewall.

\* \* \* \* \*